(12) United States Patent
Lee et al.

(10) Patent No.: US 12,156,332 B2
(45) Date of Patent: Nov. 26, 2024

(54) CELL BALANCING MODULE

(71) Applicant: LG INNOTEK CO., LTD., Seoul (KR)

(72) Inventors: Joo Young Lee, Seoul (KR); Sang Ah Lee, Seoul (KR); Yong Seok Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 214 days.

(21) Appl. No.: 17/914,496

(22) PCT Filed: Mar. 26, 2021

(86) PCT No.: PCT/KR2021/003792
§ 371 (c)(1),
(2) Date: Sep. 26, 2022

(87) PCT Pub. No.: WO2021/194309
PCT Pub. Date: Sep. 30, 2021

(65) Prior Publication Data
US 2023/0129190 A1    Apr. 27, 2023

(30) Foreign Application Priority Data
Mar. 27, 2020    (KR) .................. 10-2020-0037701

(51) Int. Cl.
*H05K 1/02*        (2006.01)
*H01G 9/008*    (2006.01)
(Continued)

(52) U.S. Cl.
CPC ............ *H05K 1/141* (2013.01); *H02J 7/0014* (2013.01); *H05K 1/0203* (2013.01)

(58) Field of Classification Search
CPC ........ H05K 1/02; H05K 1/0203; H05K 1/141; H05K 1/144; H02J 7/0014; H02J 7/0048;
(Continued)

(56) References Cited

U.S. PATENT DOCUMENTS

| | | | | |
|---|---|---|---|---|
| 2004/0150926 A1* | 8/2004 | Wilk | ...................... | H01G 9/008 361/42 |
| 2005/0041370 A1* | 2/2005 | Wilk | ...................... | H01G 9/008 361/502 |

(Continued)

FOREIGN PATENT DOCUMENTS

| | | |
|---|---|---|
| EP | 2 978 044 A1 | 1/2016 |
| JP | 2018-50454 A | 3/2018 |

(Continued)

OTHER PUBLICATIONS

Carlucho et al., "A Modular Battery Management System for Electric Vehicles," IEEE Biennial Congress of Argentina, Jun. 6, 2018, pp. 1-6.
(Continued)

*Primary Examiner* — Xiaoliang Chen
(74) *Attorney, Agent, or Firm* — Birch, Stewart, Kolasch & Birch, LLP

(57) ABSTRACT

A cell balancing module according to an embodiment of the present invention comprises: a main board on which a plurality of cell balancing resistors are mounted; at least one sub-board on which a plurality of cell balancing resistors are mounted and which is formed above the main board while being spaced a predetermined distance apart therefrom; and at least one connector which supports the sub-board to be spaced apart from the main board and electrically connects the sub-board to the main board.

14 Claims, 9 Drawing Sheets

(51) Int. Cl.
  *H01G 9/12* (2006.01)
  *H01G 9/14* (2006.01)
  *H01G 9/26* (2006.01)
  *H01G 11/10* (2013.01)
  *H01G 11/16* (2013.01)
  *H01G 11/18* (2013.01)
  *H01G 11/74* (2013.01)
  *H01G 11/76* (2013.01)
  *H01G 11/82* (2013.01)
  *H01M 50/209* (2021.01)
  *H01M 50/284* (2021.01)
  *H02J 7/00* (2006.01)
  *H02J 7/14* (2006.01)
  *H05K 1/14* (2006.01)

(58) Field of Classification Search
  CPC ............ H01M 10/425; H01M 10/443; H01M 10/486; H01M 10/4207; H01M 50/209; H01M 50/284; H01G 9/008; H01G 9/12; H01G 9/14; H01G 9/26; H01G 11/10; H01G 11/16; H01G 11/18; H01G 11/74; H01G 11/76; H01G 11/82; B06L 58/13; B06L 58/22
  USPC ...... 361/760, 42, 272, 502, 702, 811; 429/7; 439/79
  See application file for complete search history.

(56) References Cited

U.S. PATENT DOCUMENTS

| | | | |
|---|---|---|---|
| 2007/0002518 A1* | 1/2007 | Wilk | H01G 11/10 361/272 |
| 2007/0224854 A1* | 9/2007 | Bacha | H05K 1/144 439/79 |
| 2008/0068801 A1* | 3/2008 | Wilk | H01G 11/18 361/811 |
| 2013/0108894 A1* | 5/2013 | Jung | H01M 50/209 429/7 |
| 2014/0152261 A1 | 6/2014 | Yamauchi et al. | |
| 2014/0266050 A1 | 9/2014 | Biskup | |
| 2020/0329538 A1* | 10/2020 | Nicolaides | H05B 45/46 |
| 2021/0265671 A1* | 8/2021 | Chung | H02J 7/0048 |

FOREIGN PATENT DOCUMENTS

| | | |
|---|---|---|
| KR | 10-2013-0048633 A | 5/2013 |
| KR | 10-2019-0000142 A | 1/2019 |
| KR | 10-2019-0078896 A | 7/2019 |

OTHER PUBLICATIONS

Extended European Search Report for European Application No. 21776470.3, dated Mar. 28, 2024.

* cited by examiner

610

620

CELL BALANCING MODULE

CROSS REFERENCE TO RELATED APPLICATIONS

This application is the National Phase of PCT International Application No. PCT/KR2021/003792, filed on Mar. 26, 2021, which claims priority under 35 U.S.C. § 119(a) to Patent Application No. 10-2020-0037701, filed in the Republic of Korea on Mar. 27, 2020, all of which are hereby expressly incorporated by reference into the present application.

TECHNICAL FIELD

The present invention relates to a cell balancing module, and more particularly, to a cell balancing module in which a cell balancing resistor is mounted using a stack structure.

BACKGROUND ART

When charging and discharging a battery pack for a car, a voltage difference between cells naturally occurs, and if it is used continuously in this state, some batteries may become overcharged and there is a risk of fire and some batteries are in an over-discharged state, causing problems such as shortening the lifetime of the battery pack.

In order to prevent this, a current is applied to a resistor connected to the cells of the battery pack to consume the voltage of each cell as heat, thereby performing balancing among the cells. While consuming the voltage of the cell in a limited space as heat, the resistor causes a rapid temperature rise, and to prevent this, the temperature is controlled by reducing the current, however, since this affects the cell balancing time, it is necessary to optimize the design by improving the position, arrangement, and driving method without reducing the current.

DETAILED DESCRIPTION OF THE INVENTION

Technical Subject

The technical problem to be solved by the present invention is to provide a cell balancing module for mounting a cell balancing resistor using a stack structure and a method for manufacturing the cell balancing module.

The problems of the present invention are not limited to the problems mentioned above, and other problems not mentioned will be clearly understood by those skilled in the art from the following description.

Technical Solution

In order to solve the above technical problem, a cell balancing module according to an embodiment of the present invention comprises: a main board on which a plurality of cell balancing resistors are mounted; at least one sub-board on which a plurality of cell balancing resistors are mounted and which is formed above the main board while being spaced a predetermined distance apart therefrom; and at least one connector which supports the sub-board to be spaced apart from the main board and electrically connects the sub-board to the main board.

In addition, the sub-board may have the plurality of cell balancing resistors being formed on a surface facing or opposite to the main substrate.

In addition, the plurality of cell balancing resistors may consume a voltage of each battery cell by connecting two cell balancing resistors in series for each battery cell.

In addition, the plurality of cell balancing resistors formed on the main substrate and the plurality of cell balancing resistors formed on the sub-board may be alternately disposed so that positions are not being overlapped with each other.

In addition, the sub-board the sub-board has a heat dissipation unit being formed on a surface not being mounted with the plurality of cell balancing resistors thereon.

In addition, it may include a control unit being mounted on the main substrate to control the connection of the plurality of cell balancing resistors.

In addition, the sub-boards may be plural, and connectors may be formed between the sub-boards adjacent to each other so that the adjacent sub-boards may be formed to be spaced apart from each other by a predetermined interval.

In addition, the connector may connect the main board and the sub-board through a connection line patterned therein.

In addition, at least one of an interval between cell balancing resistors, the number of cell balancing resistors, and the number of sub-boards may vary depending on heat density, balancing time, number of cells performing balancing, or space of cell balancing module.

In order to solve the above technical problem, a method for manufacturing a cell balancing module according to an embodiment of the present invention comprising the steps of: mounting a cell balancing resistor on one or more sub-boards, and connecting a connector to form a resistor module; mounting a cell balancing resistor and a control unit controlling a cell balancing resistor on a main board; and stacking the resistor module on a cell balancing resistor of the main board.

Advantageous Effects

According to embodiments of the present invention, a larger number of resistors can be mounted using a stack structure, so that a plurality of cells can be balanced, and the time for cell balancing can be shortened. In addition, various resistors are available and the size of the cell balancing module can be reduced, thereby enabling compact and slim design. In addition, the heat density is reduced, which can reduce the temperature of the resistors and the module.

The effect according to the invention is not limited by the contents exemplified above, and more various effects are included in the present specification.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
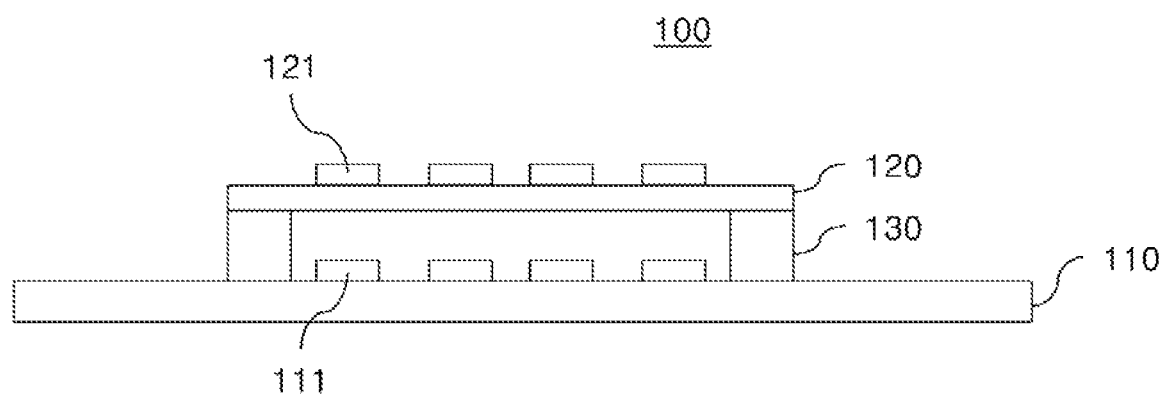
FIG. 1 illustrates a cell balancing module according to an embodiment of the present invention.

FIG. 1 illustrates a cell balancing module according to an embodiment of the present invention.

The cell balancing module 100 according to an embodiment of the present invention comprises a main board 110, a sub-board 120, and a connector 130, and may further includes a control unit 300 and a heat dissipation unit 140.

Figure 2:
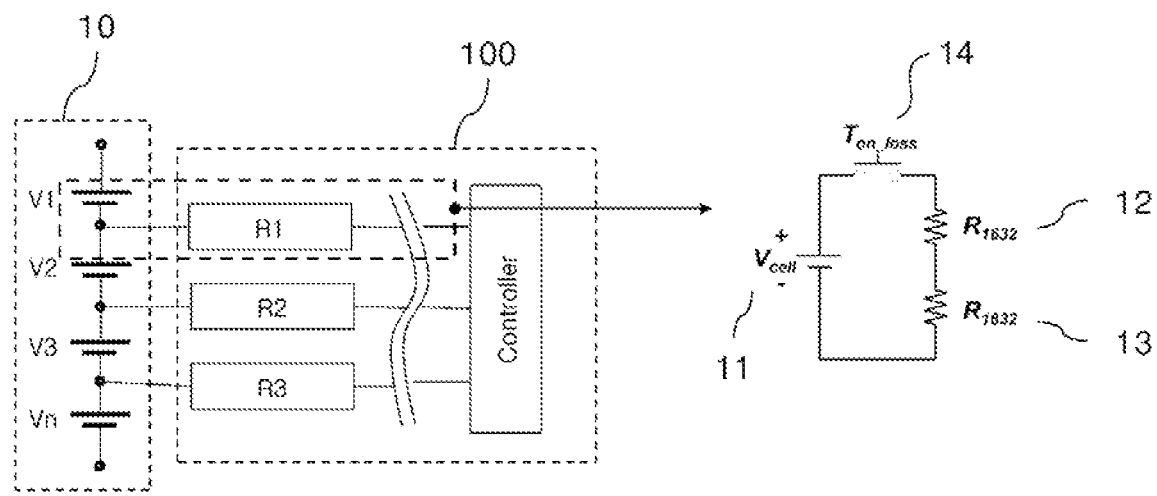
FIGS. 2 to 4 are diagrams for explaining a cell balancing process according to an embodiment of the present invention.

Cell balancing for a battery is to control the voltage of each cell being connected, as shown in FIG. 2, to be the same, and when the cell balancing is performed all of the voltages being charged in each cell become equal (V1=V2=V3=Vn). For cell balancing, the cell balancing module 100 may include resistors R1 to R3 that consume the voltage of the cell and a control unit 300 for controlling the voltage consumption of the cell using each resistor. For cell balancing, a cell of the cell balancing module 100 may include resistors R1 to R3 that consume voltage and a control unit 300 for controlling voltage consumption of the cell by using each resistor. Among the resistors connected to each cell, a resistor connected to the cell whose voltage is higher than the voltage of the other cell is connected to the cell to form a closed loop, so that current flows, and the voltage of the cell is consumed through the flowing current, thereby balancing the cells. This is called a passive balancing.

For cell balancing, two resistors 12 and 13 are connected to each cell 11, and the voltage of the cell is consumed through a current flowing therethrough. The cell balancing operation is controlled through the on/off of the switch 14 by the control of the control unit 300.

Figure 3:
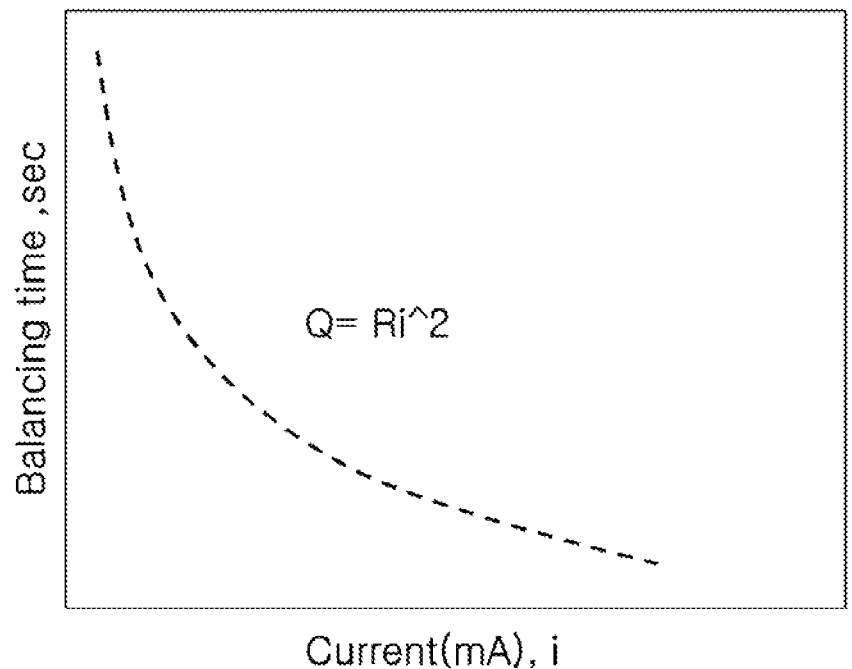
Figure 4:
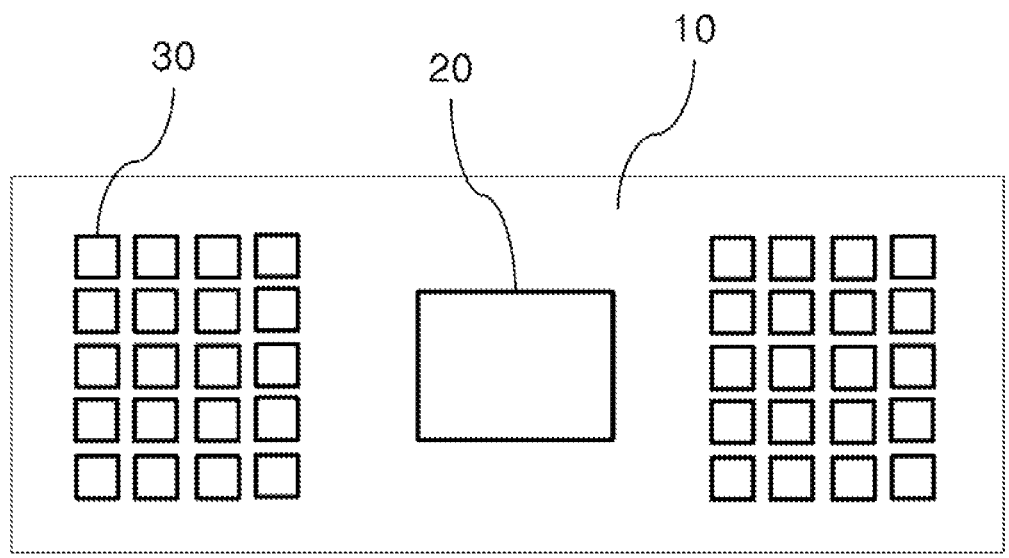

When cell balancing is performed, the relationship between the current flowing through the resistor and the balancing time is shown in FIG. 3. As the current flowing through the resistor is increased, the voltage change in each cell has a very fast response speed. In addition, as shown in FIG. 4, when the resistor 30 is mounted on the substrate 10 and cell balancing is performed by the control of the control units 300 and 20, as the number of resistors 30 increases, power consumption can be increased, and thus, the balancing time can be reduced.

However, when the current in each resistor 30 is increased, the power consumption in each resistor increases, so that a rapid temperature rise may occur inside the resistor and the module. When the number of resistors 30 is increased, the size of the substrate 10 increases according to the space occupied by the resistors, and accordingly, the size of the case also increases, resulting in an increase in cost. In addition, when a plurality of resistors 30 are simultaneously used in a limited space, hot spots may occur due to an increase in heat density generated in the resistors, thereby causing a risk of failure or fire.

For efficient cell balancing, the cell balancing module 100 according to an embodiment of the present invention includes a stack structure having one or more sub-boards 120 being formed and spaced apart from each other by a predetermined interval in an upper portion of the main substrate 110 on which a plurality of cell balancing resistors 111 are mounted.

The sub-board 120 and the main board 110 are electrically connected to each other through one or more connectors 130, and the connector 130 supports the sub-board 120 so that the sub-board 120 can be spaced apart from the main board 110.

Since it is possible to expand the mounting space by mounting the cell balancing resistors 111 and 121 on the main board 110 and the sub-board 120, respectively, efficient design of cell balancing resistors for cell balancing is possible. The cell balancing resistors 111 and 121 mounted on the main board 110 and the sub-board 120 may have two cell balancing resistors connected in series for each battery cell so that a voltage flowing from each battery cell can be consumed. On the main board 110 and the sub-board 120, an on/off switch may be mounted to control the connection between the two cell balancing resistors and the cell. On/off of the corresponding switch may be controlled by the control unit 300.

The connector 130 serves to support the stack structure of the sub-board 120 and to connect the sub-board 120 and the main board 110. At this time, the connector 130 may have a patterned connection line therein, and may connect the main board 110 and the sub-board 120 through the patterned connection line therein. The control unit 300 for controlling power consumption in the cell balancing resistors 111 and 121 may be mounted on the main board 110 as shown in FIG. 5.

The control unit 300 being mounted on the main board 110, may control not only the connection of the cell balancing resistor 121 mounted on the sub-board 120 but also the cell balancing resistor 111 mounted on the main board 110. That is, one control unit 300 may control the connection of all cell balancing resistors mounted on the cell balancing module 100. It is natural that multiple control units 300 may be used depending on the number of cell balancing resistors or the performance or control design of the control unit 300.

In order for the control unit 300 to control the connection of the cell balancing resistor 121 mounted on the sub-board 120, the control signal of the control unit 300 needs to be transferred to the cell balancing resistor 121 mounted on the sub-board 120, so a conductive line is required to connect them. The connector 130 includes a connection line being patterned such as a penetrating electrode therein, and may connect the electrode of the main board 110 and the electrode of the sub-board 120 through the connection line. A feed line and a ground line are formed in the connector 130 so that a closed loop including a resistor may be formed. The connector 130 formed with a connection line patterned therein and formed with terminals, at both ends thereof, where the main board 110 and the sub-board 120 are connected can be easily coupled by connecting the corresponding terminal to the main board 110 and the sub-board 120. Through this, the manufacturing process of the cell balancing module 100 becomes simplified, and the process speed can be increased.

Figure 5:
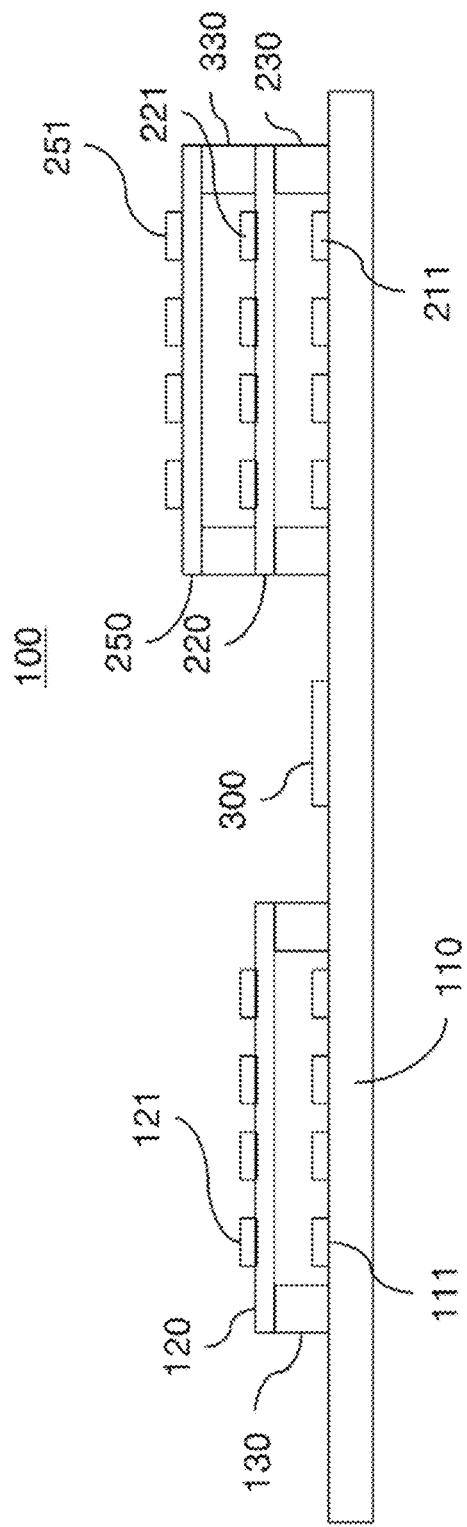
FIGS. 5 to 8 illustrate a cell balancing module according to various embodiments of the present invention.

In mounting the cell balancing resistor, as shown in FIG. 5, the cell balancing resistors 111 and 211 may be mounted on the main board 110 in both directions of the control unit 300, each of the sub-boards 120 and 220 are stacked on the main board 110 on which each cell balancing resistor is mounted, and cell balancing resistors 121 and 221 may be mounted on each of the sub-boards 120 and 220.

As shown in FIG. 5, the sub-board being stacked on the main board 110 may be in plural as 220 and 250, and a connector 330 is formed between the sub-boards 220 and 250 adjacent to each other so that the sub-boards 220 and 250 adjacent to each other may be formed to be spaced apart from each other by a predetermined interval. By stacking the sub-board in multiple layers instead of one layer, the space for mounting the cell balancing resistor can be further expanded. Each of the sub-boards 220 and 250 are spaced apart from each other by a connector 330, and may be connected to each other through the connector 330.

As described above, various cell balancing resistor designs are possible by using a stack structure in which the sub-board 120 is stacked on an upper portion of the main board 110. At least one or more of an interval between cell balancing resistors, the number of cell balancing resistors, and the number of sub-boards may vary according to heat density, balancing time, the number of cells performing balancing, or the space of a cell balancing module.

Figure 6:
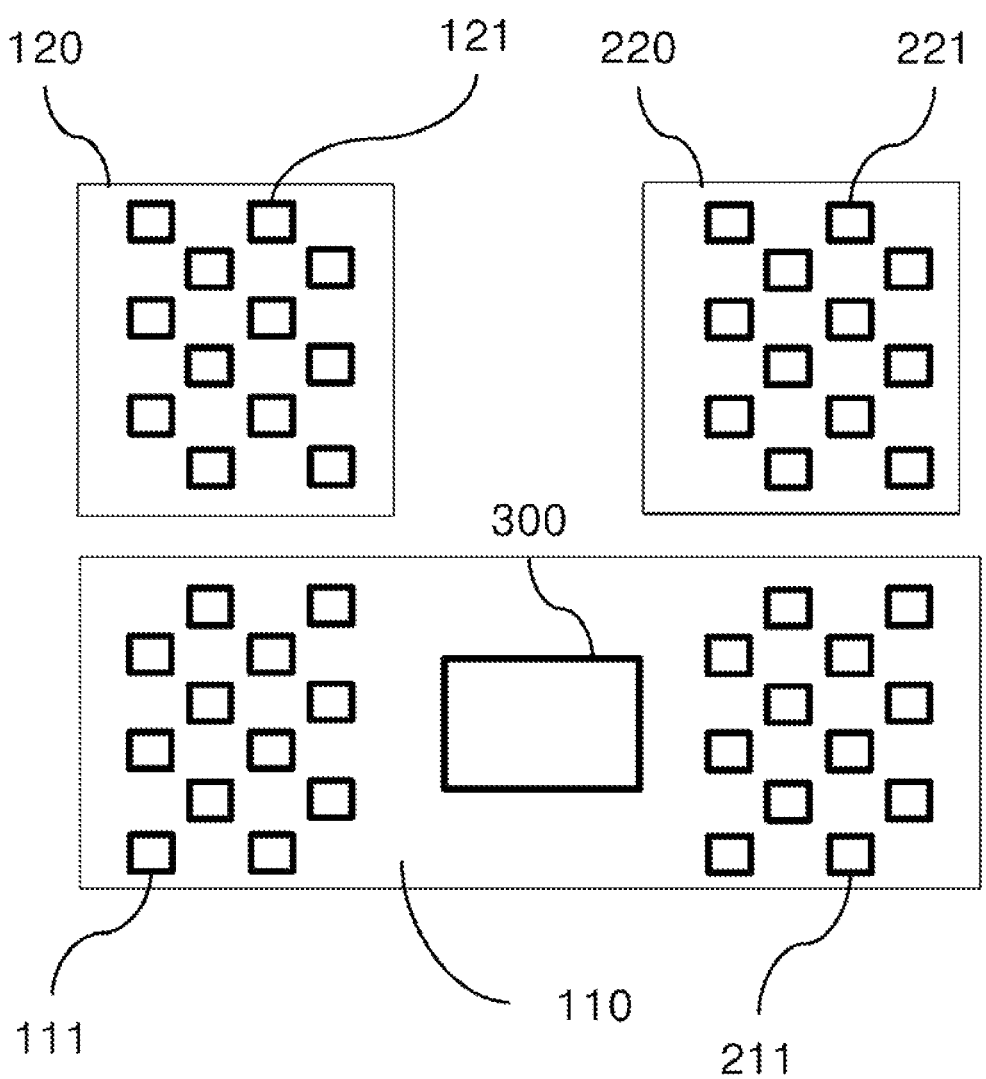

FIGS. 5 to 8 illustrate a cell balancing module according to various embodiments of the present invention, as shown in FIG. 6, the plurality of cell balancing resistors 121 and 231 being formed on the main substrate 110 and the plurality of cell balancing resistors 111 and 211 being formed on the sub-boards 120 and 220 may be disposed to cross each other so that positions are not overlapped with each other. Since there is no cell balancing resistor being overlapped in up and down direction, the heat density is reduced by half. When the heat density is reduced by half, the risk of heat generation can be lowered, and a large current can be used. Through this, the current can be increased four times compared to the existing one, and as shown in FIG. 3, since the cell balancing time is inversely proportional to the square of the magnitude of the current, the cell balancing time can be reduced by 1/16.

Figure 7:
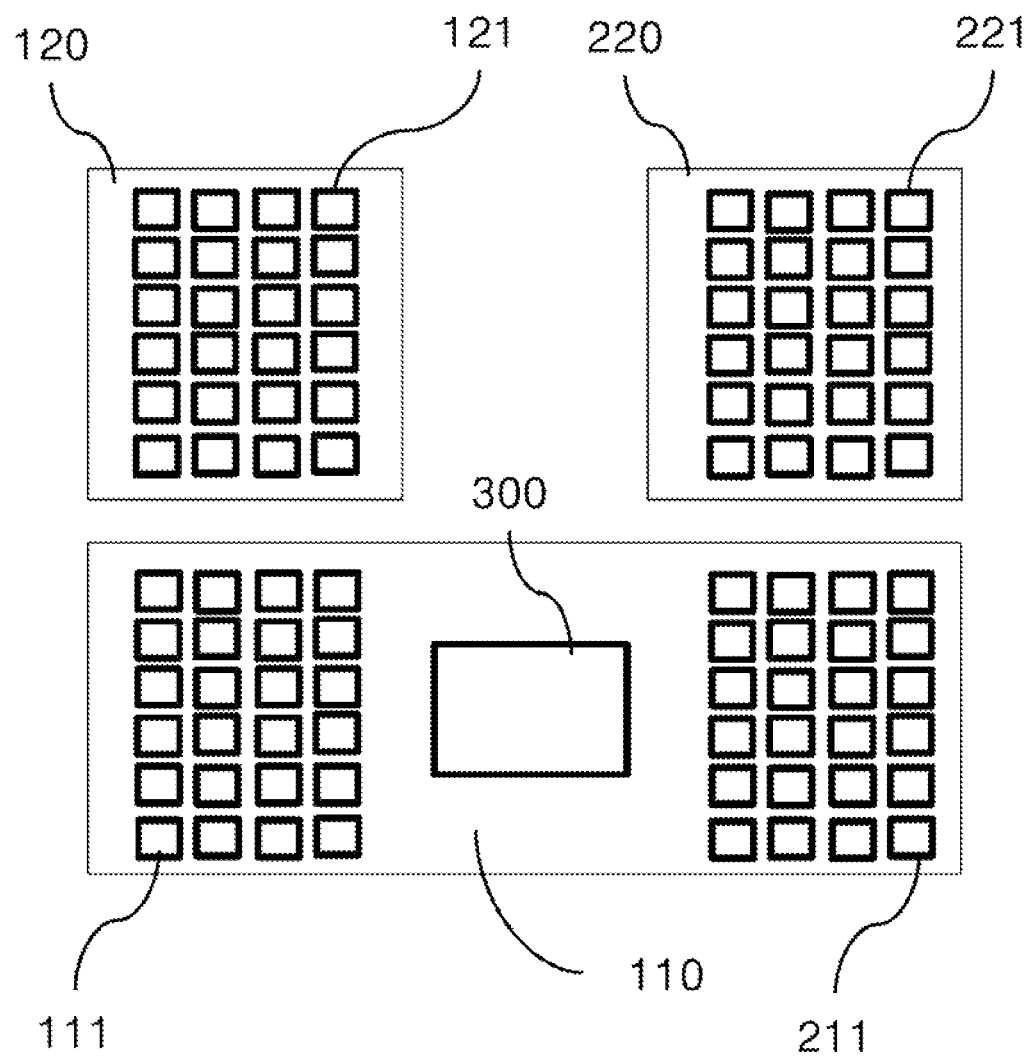

Or, as shown in FIG. 7, the number of cell balancing resistors mounted on the cell balancing module 100 may be doubled by stacking the sub-boards 120 and 220 on the main board 110. In this case, unlike FIG. 6, the heat density is the same, but the number of cells capable of balancing the existing cells can be doubled. That is, the number of cells capable of cell balancing can be increased with one cell balancing module 100.

Figure 8:
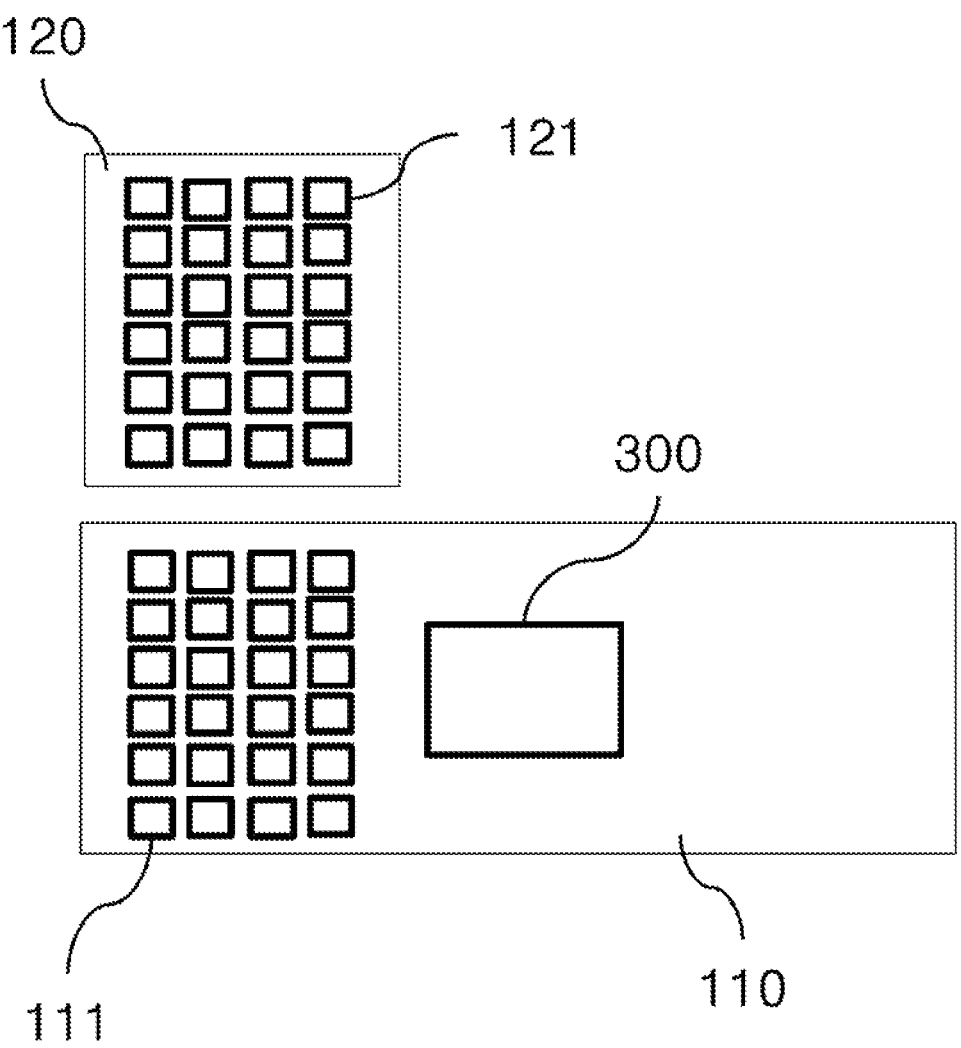

In addition, as shown in FIG. 8, the number of cell balancing resistors being mounted on the main board 110 is reduced by half, but a space in which the cell balancing resistor is mounted may be formed in only one direction of the control unit 300 by laminating the sub-board 120. In this case, unlike FIG. 6, the heat generation density is the same as before, but the size of the substrate can be reduced. That is, since the overall size of the cell balancing module 100 can be reduced, miniaturization is possible.

As shown in FIGS. 6 to 8, the spacing between cell balancing resistors, the number of cell balancing resistors, and the number of sub-boards are determined depending on the heat density, balancing time, the number of cells performing balancing, or the space of the cell balancing module, and accordingly, the cell balancing module 100 may be designed.

Figure 9:
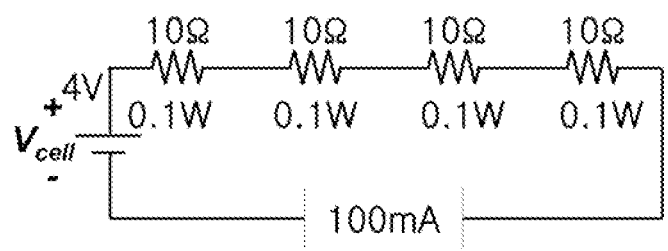
FIG. 9 is a diagram for explaining the design of the resistor of a cell balancing module according to an embodiment of the present invention.
Figure 9:
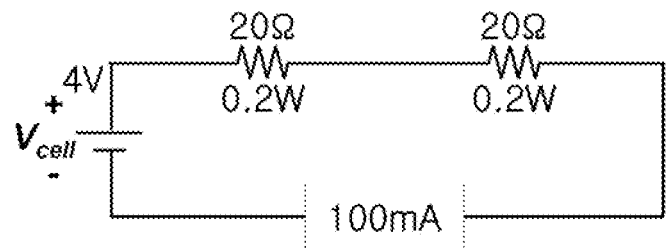
Figure 9:
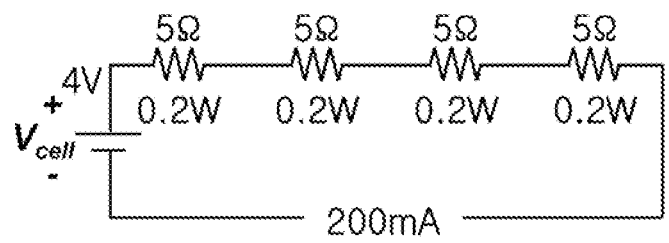

In addition, as shown in FIG. 9, the number of resistors may be increased using a stack structure, but different resistor values of the cell balancing resistor may be applied.

First, by using the stack structure, the power consumed by all resistors is maintained the same, and the resistor value of each resistor can be reduced in half (610). In this case, although the current flowing through the cell balancing circuit is the same, individual resistor values are reduced to reduce individual heat generation. That is, the heat density can be reduced.

Or, each resistor value may be reduced while maintaining the same power consumption (620). In this case, the current flowing through the cell balancing circuit is doubled, and thus, the cell balancing time can be shortened.

The sub-board 120 is formed to be spaced apart from the main substrate 110, and a plurality of cell balancing resistors 121 may be mounted on a surface facing or opposite to the main substrate 110. As shown in FIG. 1, the cell balancing resistor 121 is mounted on the opposite surface of the surface facing the main board 110, or as shown in FIG. 10, the cell balancing resistor 121 may be mounted on a surface facing the main substrate 110.

At this time, in the sub-board 120, the heat dissipation unit 140 may be formed on a surface on which the plurality of cell balancing resistors 121 is not mounted. When the heat dissipation unit 140 is formed on the sub-board 120, in order to increase heat dissipation efficiency, the heat dissipation unit 140 may be formed to face the outside. As such, when the heat dissipation unit 140 is formed outside, that is, in an upper direction of the main substrate 110, the cell balancing resistor 121 being mounted on the sub-board 120 may be mounted on a surface facing the main board 110. When the heat dissipation unit 140 is not formed, the cell balancing resistor 121 being mounted on the sub-board 120 may be mounted on a surface opposite to the surface facing the main board 110 so as to form a distance between the cell balancing resistors farther.

Figure 10:
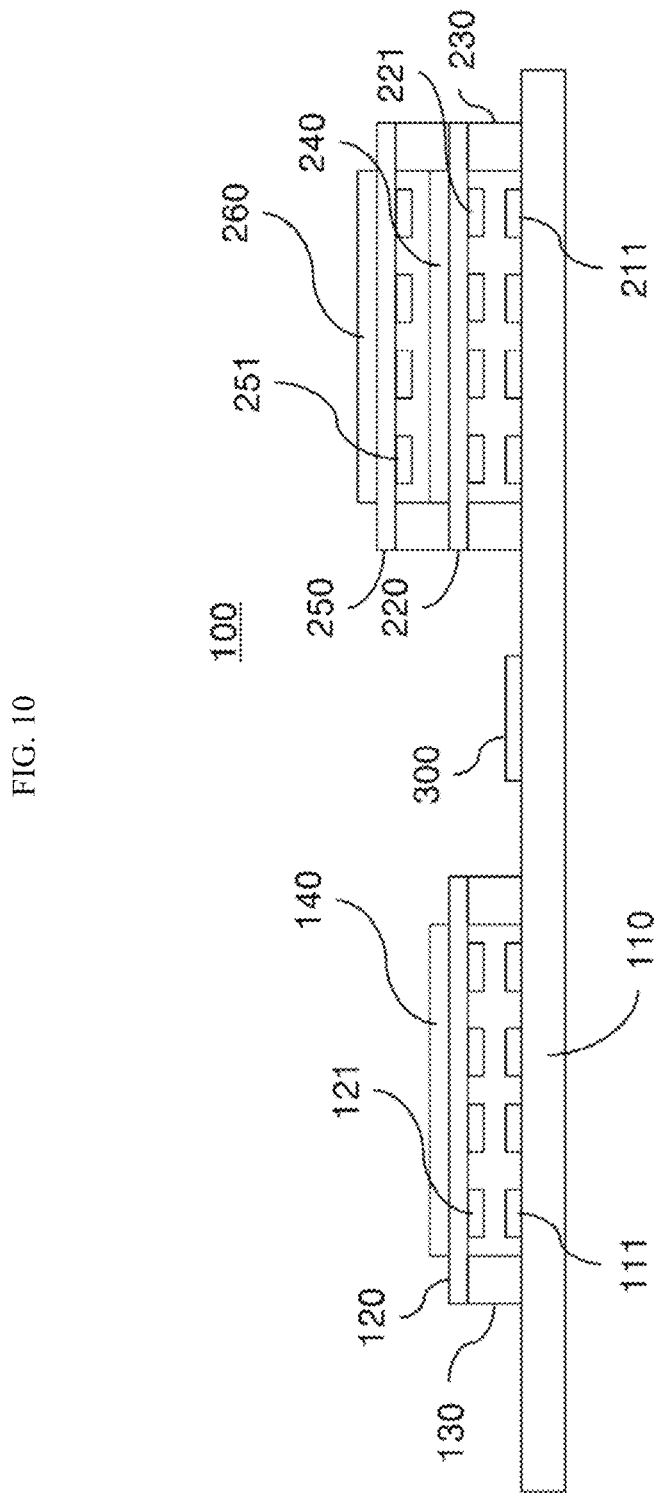
FIG. 10 illustrates a cell balancing module according to another embodiment of the present invention.

It is natural that the sub-board 120 on which the heat dissipation unit 140 is formed may also be stacked in a plurality of layers 220 and 250 as shown in FIG. 10. The cell balancing module 100 formed as described above may be manufactured through the following process.

First, a cell balancing resistor is mounted on one or more sub-boards, and a connector is connected to form a resistor module, and the cell balancing resistor and the control unit 300 for controlling the cell balancing resistor is mounted on the main board, and then the resistor module is stacked on the cell balancing resistor of the main board, and thereby the cell balancing module 100 may be manufactured.

Figure 11:
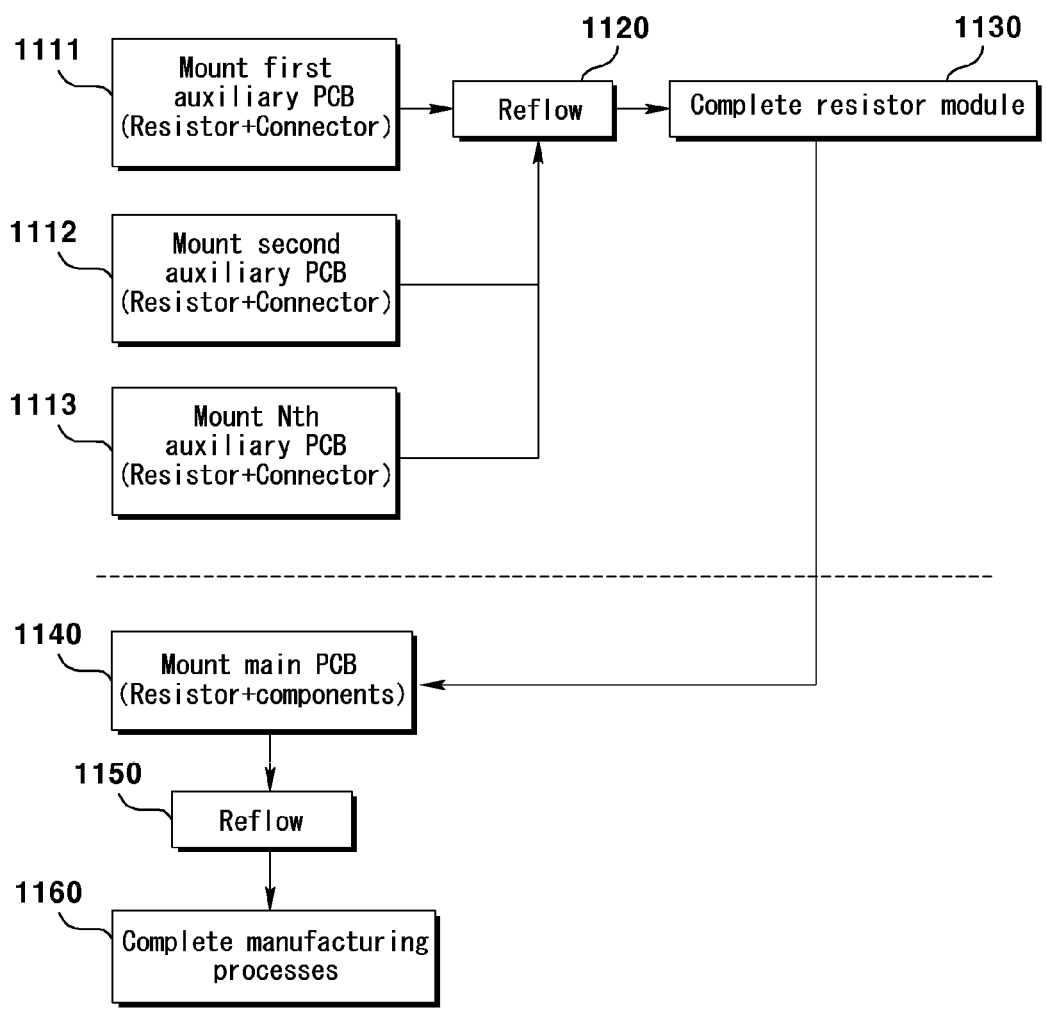
FIG. 11 is a diagram for explaining a method of manufacturing a cell balancing module according to an embodiment of the present invention.

More specifically, as shown in FIG. 11, cell balancing resistors may be mounted on each sub-board stacked on the main board and connectors may be connected (1111, 1112, and 1113).

Here, a process of forming a heat sink such as a heat dissipation unit on the sub-board may be performed. The heat sink may be formed at an upper portion or a lower portion of the sub-board. In addition, the connector may be an interface connector in which a patterned connection line is formed, and may be connected to the sub-board through soldering. Thereafter, a resistor module may be formed (1130) through reflow soldering (1120) for the sub-boards. Here, the reflow soldering is a process of supplying an appropriate amount of solder to a joint in advance, and then melting the solder by a heat source from the outside to perform soldering.

Thereafter, the necessary parts such as the cell balancing resistor and the control unit 300 are mounted on the main board (1140), and the cell balancing module manufacturing process may be completed (1160) via reflow soldering of the resistor module on the main board (1150).

As described above, since the cell balancing module manufactured and formed by the sub-board being modularized into a resistor module and stacked, standardization is possible because the number of resistor modules being stacked can be freely designed according to the required number. In addition, a larger number of resistors can be mounted through the stack structure enabling cell balancing for a larger number of cells, and the cell balancing current can be increased depending on the design to shorten the cell balancing time. In addition, resistors of various sizes and capacities can be utilized. In terms of size, 3216 resistors can be mounted on the main board and 6432 resistors can be mounted on the sub-board, and resistors of various capacities such as 1 ohm or 2 ohms can be used. In forming the sub-board, since various substrates can be used, the degree of freedom of substrate specifications such as thickness, layer, and copper specifications of the substrate is increased. As the degree of freedom of design increases, the sub-board can be manufactured in a process separate from the main board, and compact and slim design becomes possible. In addition, by using a connector that is easy to connect, it is possible to free from the problem of short circuit in the joint and realize assembly automation such as reflow. Since it is possible to design various cell balancing resistors, it is possible to design to reduce heat density, and to control on/off alternated by layers, and thereby the temperature rise of the resistor and module can be reduced.

Although embodiments of the present invention have been described with reference to the accompanying drawings, those of ordinary skill in the art to which the present invention belongs will be able to understand that the present invention can be embodied in other specific forms without changing its technical spirit or essential features. Therefore, it should be understood that the embodiments described above are illustrative in all respects and not restrictive.

The invention claimed is:

1. A cell balancing module comprising:
   a main substrate on which a plurality of cell balancing resistors are mounted;
   at least one sub-substrate on which a plurality of cell balancing resistors are mounted and which is formed above the main substrate while being spaced a predetermined distance apart therefrom; and
   at least one connector supporting the sub-substrate to be spaced apart from the main substrate and electrically connecting the sub-substrate to the main substrate.

2. The cell balancing module according to claim 1, wherein the sub-substrate has the plurality of cell balancing resistors being formed on a surface facing or a surface opposite to the main substrate.

3. The cell balancing module according to claim 1, wherein the plurality of cell balancing resistors consume a voltage of each battery cell by connecting two cell balancing resistors in series for each battery cell.

4. The cell balancing module according to claim 1, wherein the plurality of cell balancing resistors formed on the main substrate and the plurality of cell balancing resistors being formed on the sub-substrate is alternately disposed so that positions are not being overlapped with each other.

5. The cell balancing module according to claim 1, wherein the sub-substrate has a heat dissipation unit being formed on a surface not being mounted with the plurality of cell balancing resistors thereon.

6. The cell balancing module according to claim 1, comprising:
   a control unit being mounted on the main substrate to control the connection of the plurality of cell balancing resistors.

7. The cell balancing module according to claim 1, wherein the sub-substrate comprises a plurality of sub-substrates, and connectors are formed between the sub-substrates adjacent to each other so that the adjacent sub-substrates are formed to be spaced apart from each other by a predetermined interval.

8. The cell balancing module according to claim 1, wherein the connector connects the main substrate and the sub-substrate through a connection line patterned therein.

9. The cell balancing module according to claim 1, wherein the connector has connection terminals being connected to the main substrate and the sub-substrate, at both ends thereof.

10. The cell balancing module according to claim 1, wherein at least one of an interval between cell balancing resistors, number of cell balancing resistors, and number of sub-substrate varies depending on heat density, balancing time, number of cells performing balancing, or space of cell balancing module.

11. The cell balancing module according to claim 1, comprising:
    a switch configured to connect or disconnect the cell balancing resistors to battery cell.

12. The cell balancing module according to claim 1, wherein the switch is mounted on at least one of the main substrate and the sub-substrate.

13. The cell balancing module according to claim 1, wherein the sub-substrate comprises a plurality of sub-substrates stacked in multiple layers.

14. The cell balancing module according to claim 1, wherein the sub-substrate has the plurality of cell balancing resistors being formed on both a surface facing and a surface opposite to the main substrate.

* * * * *